(12) United States Patent
Metz et al.

(10) Patent No.: US 7,999,351 B2
(45) Date of Patent: Aug. 16, 2011

(54) PHASE MEMORIZATION FOR LOW LEAKAGE DIELECTRIC FILMS

(75) Inventors: Matthew Metz, Hillsboro, OR (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 451 days.

(21) Appl. No.: 12/215,322

(22) Filed: Jun. 25, 2008

(65) Prior Publication Data

US 2009/0321941 A1 Dec. 31, 2009

(51) Int. Cl.
*H01L 29/92* (2006.01)
(52) U.S. Cl. .. 257/532; 257/304; 257/310; 257/E29.343
(58) Field of Classification Search ............ 257/634, 257/644
See application file for complete search history.

(56) References Cited

U.S. PATENT DOCUMENTS

| 6,953,721 | B2 * | 10/2005 | Agarwal | 438/240 |
| 7,728,376 | B2 * | 6/2010 | Matsui et al. | 257/310 |
| 2005/0212031 | A1 * | 9/2005 | Yamamoto | 257/310 |
| 2006/0060930 | A1 | 3/2006 | Metz | |

FOREIGN PATENT DOCUMENTS

| KR | 10-2003-0408742 B1 | 12/2003 |
| KR | 10-2005-0042171 A | 5/2005 |
| WO | 2009/158193 A2 | 12/2009 |
| WO | 2009/158193 A3 | 3/2010 |

OTHER PUBLICATIONS

International Search Report/Written Opinion for Patent Application No. PCT/US2009/046897, mailed Feb. 3, 2010, 10 pages.
Gilbert Dewey, et al., "Controlled Deposition of HFO2 and ZRO2 Dielectrics", U.S. Appl. No. 11/863,211, filed Sep. 27, 2007.
International Preliminary Report on Patentability received for PCT Patent Application No. PCT/US2009/046897, mailed on Jan. 13, 2011, 4 pages.

\* cited by examiner

*Primary Examiner* — Stephen W Smoot
(74) *Attorney, Agent, or Firm* — Scott M. Lane

(57) ABSTRACT

Embodiments of a phase-stable amorphous high-κ dielectric layer in a device and methods for forming the phase-stable amorphous high-κ dielectric layer in a device are generally described herein. Other embodiments may be described and claimed.

13 Claims, 4 Drawing Sheets

PHASE MEMORIZATION FOR LOW LEAKAGE DIELECTRIC FILMS

FIELD OF THE INVENTION

The field of invention relates generally to the field of semiconductor integrated circuit manufacturing and, more specifically but not exclusively, relates to microelectronic devices with a low leakage dielectric layer that resists crystallization when exposed to thermal treatment.

BACKGROUND INFORMATION

Silicon dioxide has been used as a dielectric layer in the manufacture of integrated circuits. As thickness of the dielectric layer scales below 2 nanometers, leakage currents can increase drastically, leading to increased power consumption and reduced device reliability. Replacing silicon dioxide with a high-κ material can provide an integrated circuit manufacturer with an alternative to progressively smaller dielectric layer thicknesses while allowing for increased capacitance of the device. Conventional methods of depositing a high-κ dielectric film on a semiconductor substrate include physical vapor deposition (PVD), metalorganic chemical vapor deposition (MOCVD) and atomic layer deposition (ALD).

BRIEF DESCRIPTION OF THE DRAWINGS

The present invention is illustrated by way of example and not as a limitation in the figures of the accompanying drawings, in which.

DETAILED DESCRIPTION

Systems and methods for forming low leakage dielectric films are described in various embodiments. In the following description, numerous specific details are set forth such as a description of methods for fabricating crystallization-resistant high dielectric constant films and embodiments of devices comprising crystallization-resistant high dielectric constant films. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

It would be an advance in the art to control and/or minimize phase transformation of one or more high dielectric constant (high-κ) dielectric layers during fabrication of a microelectronic device. High-κ dielectric layers may be selectively formed in a fully amorphous state to minimize leakage currents and to maximize capacitance across the one or more layers. High-κ dielectric layers formed with some level of crystallinity, referring to a degree of structural order in the high-κ dielectric layer, tend to change phase to a crystalline state when exposed to subsequent processes involving thermal treatments or elevated temperatures. Formation of high-κ dielectric layers in a fully amorphous state can eliminate, minimize, and/or control phase transformation of the one or more high-κ dielectric layers, thereby reducing leakage current in the device. As a result, use of methods to fabricate high-κ dielectric layers with little to no detectable crystallinity, or no substantial crystallinity, can provide for microelectronic devices or integrated circuits with reduced power consumption and increased device reliability. Ideally, high-κ dielectric layers should be fully amorphous to prevent leakage paths along grain boundaries and fabricated to provide a sharp interface between the high-κ dielectric layer and any directly adjacent layers.

In one embodiment, the method comprises providing a substrate with a conductive layer for deposition of a phase-stable amorphous high-κ dielectric layer. The substrate and the conductive layer are exposed to a first precursor to form a monolayer on a surface of the conductive layer. The monolayer is exposed to a second precursor at a deposition temperature substantially between 230 C and 270 C to form the phase-stable amorphous high-κ dielectric layer on the conductive layer.

Figure 1:
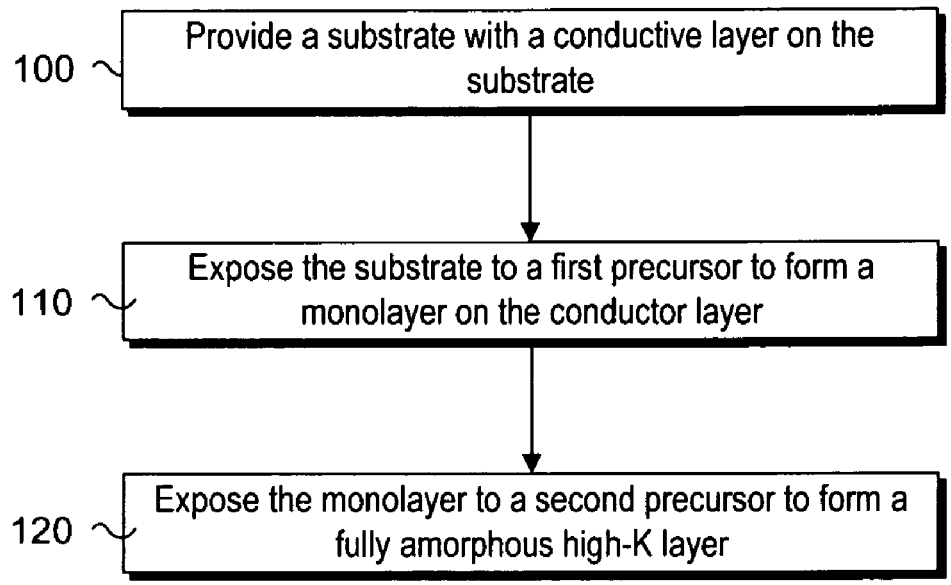
FIG. 1 is a flowchart describing one embodiment of a fabrication process used to form a phase-stable amorphous high-κ dielectric layer.

Now turning to the figures, FIG. 1 is a flowchart describing one embodiment of a fabrication process used to form an amorphous high-κ layer in a microelectronic device. In element 100, a substrate with a conductive layer on the substrate is provided. The substrate may be a bulk silicon or silicon-on-insulator substructure. Alternatively, the substrate may comprise other materials—which may or may not be combined with silicon—such as: germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention.

The conductive layer on the substrate may be formed directly on the substrate of a conductive material including one or more transition metals such as titanium (Ti), tantalum (Ta), tungsten (W), copper (Cu), aluminum (Al), titanium nitride (TiN), and tantalum nitride (TaN). In other embodiments, the conductive layer may be formed of a non-metal conductive material such as doped or undoped polysilicon. In one embodiment, the conductive layer is formed on the substrate using an atomic layer deposition (ALD) process. Generally, an ALD process involves forming a film layer-by-layer by exposing a surface to alternating pulses of reactants, each of which undergoes a self-limiting reaction, generally resulting in controlled film deposition. An advantage to using an ALD process in forming the conductive layer is that the layer may be uniform, continuous and conformal. In other embodiments, the conductive layer is deposited using one or more deposition methods including reactive sputtering, plasma enhanced chemical vapor deposition (PECVD), or physical vapor deposition (PVD).

In another embodiment, an isolation layer is formed between the substrate and the conductive layer, thereby providing a substrate with an isolation/conductive layer stack. Preferably, the isolation layer comprises silicon nitride ($Si_3N_4$). In an alternate embodiment, the isolation layer comprises one or more dielectric materials known to one skilled in the art to provide isolation between the conductive layer and the substrate. A material type and thickness of the isolation layer is selectively designed to provide electrical isolation between the substrate and the conductive layer.

In element 110, the substrate is exposed to a first precursor to form a monolayer on the conductive layer using an atomic layer deposition (ALD) process. In a preferred embodiment for the formation of a zirconium oxide layer, the first precursor may comprise zirconium tetrachloride ($ZrCl_4$) or a zirconium amide source. In another embodiment for the formation of a hafnium oxide layer, the first precursor may comprise hafnium tetrachloride or a hafnium amide source. In a further embodiment in the formation of an aluminum oxide layer, the first precursor may be aluminum chloride ($AlCl_3$) or tri-methyl aluminum ($Al(CH_3)_3$).

In element 120, the monolayer is exposed to a second precursor to form a fully amorphous high-κ layer such as zirconium oxide, hafnium oxide, or aluminum oxide. The second precursor may be one or more of water vapor (H2O), oxygen (O2), nitrous oxide (N2O), ozone (O3), one or more alcohols such as isopropyl alcohol and t-butanol, and silanols. The processes of forming a monolayer with a first precursor, optionally purging any unadsorbed first precursor, and exposing the monolayer to a second precursor can be repeatedly performed until a fully amorphous high-κ layer is obtained. The process of forming the fully amorphous high-κ layer is performed at a deposition temperature substantially between 230 C and 270 C for zirconium oxide. In this embodiment, the deposition temperature is a control temperature of the wafer and/or substrate during formation of the amorphous high-κ layer. Deposition temperature is selected for each set of precursor reactants to deposit a film that is amorphous as deposited. The degree of vacuum is controlled in the range of about 0.01-10 torr and preferably between 1-5 torr depending on an atomic layer deposition chamber design and related gas flows.

Formation of the fully amorphous high-κ layer using an ALD process in this temperature range is normally avoided due to trace contaminants that become trapped in the fully amorphous high-κ layer as an artifact of the deposition process. As deposition temperature decreases, an increasing amount of chlorine (Cl) remains trapped in the fully amorphous high-κ layer. Forming the fully amorphous high-κ layer while embedding Cl in the layer may allow one to avoid or minimize crystallization of the fully amorphous high-κ layer.

Layers manufactured according to the methods and process conditions described in embodiments of the invention tend to have more precursor by-products, for example more carbon (C) and nitrogen (N) from organic precursors and halides such as chlorine (Cl) from inorganic precursors. Also, a methyl (CH3) to oxygen (O) ratio tends to increase as a result of the process conditions due to a deficiency in available oxygen. However, a benefit to forming the fully amorphous high-κ layer using these process conditions results in a film that is fully amorphous or substantially fully amorphous, meaning there are effectively no detectable crystal structures formed in the high-κ layer.

As a result, the fully amorphous high-κ layer remains amorphous even after exposure to one or more subsequent thermal processes typically used in the formation of interconnect layers in integrated circuit manufacturing. By way of example, the fully amorphous high-κ layer has been shown to remain in an amorphous or substantially fully amorphous state when heated to 400° C. for 4 hours, which may represent cumulative backend processing. The temperature and/or time of thermal treatment may be increased selectively by thickening the fully amorphous high-κ layer. An amorphous high-κ dielectric layer exposed to one or more thermal cycles without changing from an amorphous phase to a polycrystalline phase or a crystalline phase is referred to here as a phase-stable amorphous high-κ dielectric layer.

In another embodiment, the fully amorphous high-κ layer may be formed on the substrate using a deposition method such as reactive sputtering, plasma enhanced chemical vapor deposition (PECVD), an electron-beam process, or a physical vapor deposition ("PVD") process. In such a CVD process, a metal oxide precursor (e.g., a metal chloride) and steam may be fed at selected flow rates into a CVD reactor, which is then operated at a selected temperature and pressure to generate an atomically smooth interface between the substrate and the fully amorphous high-κ layer. The CVD reactor should be operated long enough to form a layer with the desired thickness.

Some of the materials that may be used to form the high-κ layer include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form the high-κ layer are described here, the layer may be formed from other materials.

Figure 2:
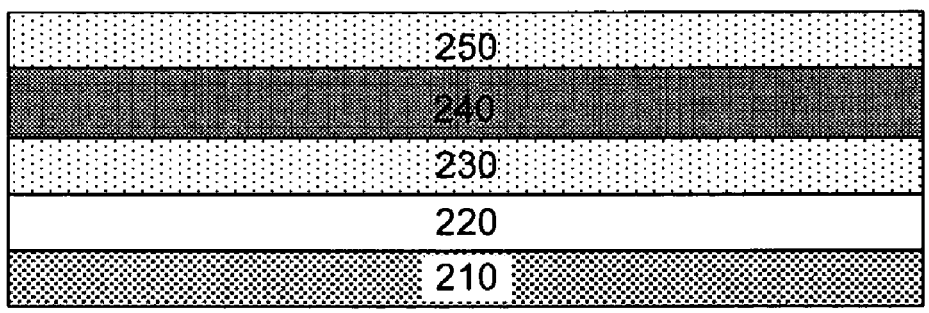
FIG. 2 is an illustration of a substrate with a phase-stable amorphous high-κ dielectric layer formed between two conductive layers to create a charge storing device.

A phase-stable amorphous high-κ dielectric layer stack 200 formed, at least in part using the methods described in FIG. 1, is illustrated in FIG. 2 wherein a phase-stable amorphous high-κ dielectric layer 240 is formed between conductive layers 230 and 250 on an isolation layer 220 on substrate 210. Preferably, the isolation layer comprises silicon nitride ($Si_3N_4$). In an alternate embodiment, the isolation layer comprises one or more dielectric materials known to one skilled in the art to provide isolation between the conductive layer and the substrate. The phase-stable amorphous high-κ dielectric layer stack 200 may be formed on a flat substrate, in or on any two dimensional or three dimensional surfaces such as the surface of a recess or well, as illustrated in the following examples. The phase-stable amorphous high-κ dielectric layer stack 200 may be referred to as one embodiment of a metal-insulator-metal stack.

Figure 3:
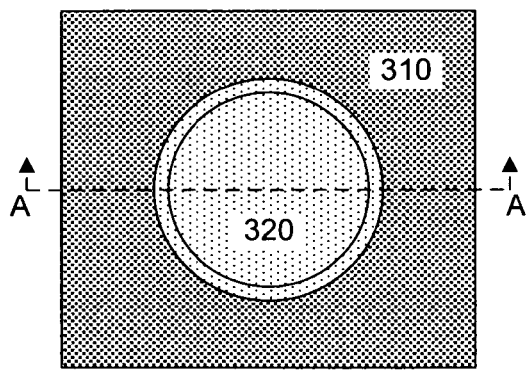
FIG. 3 is a plan layout view of a first conductive layer formed in a recess.
Figure 4:
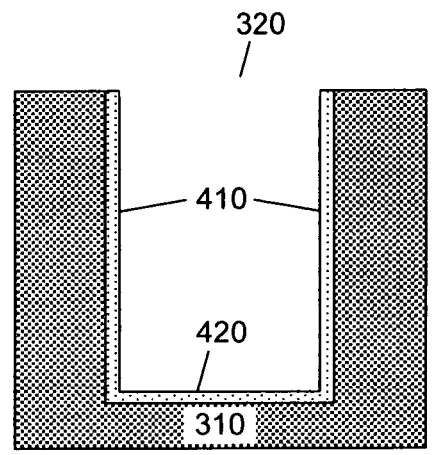
FIG. 4 is a cross-sectional view of FIG. 3 taken through section line A-A illustrating the device in FIG. 3.

FIG. 3 is a plan layout view of a first conductive layer 320 formed in a recess of an isolation region 310 such as a field oxide layer, a nitride layer, or other dielectric layer. In another embodiment, the isolation region 310 is part of the substrate 210. A thickness of the first conductive layer 320 is selectively designed to provide a signal path while allowing for additional layers to be formed in the recess. For example, a thickness of the first conductive layer 320 may range between 10-300 angstroms or more preferably between 50-100 angstroms. The first conductive layer 320 may be formed using ALD because it provides a consistent and uniform thickness and it provides a way to form the first conductive layer 320 on the vertical surfaces as shown in FIG. 4. Other deposition methods known to one skilled in the art may be used to form the first conductive layer 320 if an aspect ratio of the recess or other structure does not cause an unacceptable thickness differential along the layer.

Figure 5:
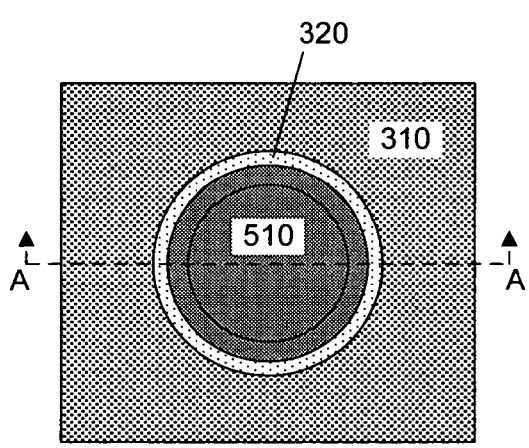
FIG. 5 illustrates one embodiment of the device of FIG. 3 after forming a phase-stable amorphous high-κ dielectric layer on the first conductive layer.

FIG. 4 is a cross-sectional view of FIG. 3 taken through section line A-A illustrating the device in FIG. 3. The first conductive layer 320 is formed in the recess with consistent and uniform thickness to provide first conductive layer sidewalls 410 and first conductive layer bottom 420. FIG. 5 illustrates one embodiment of the device of FIG. 3 after forming a phase-stable amorphous high-κ dielectric layer 510 such as $ZrO_2$, $HfO_2$, or $Al_2O_3$ on the first conductive layer 320. In one embodiment, a thickness of the phase-stable amorphous high-κ dielectric layer 510 is approximately 40 and 60 angstroms (Å).

Preferably, the phase-stable amorphous high-κ dielectric layer 510 is formed on the first conductive layer 320 without first forming an oxide on the first conductive layer 320 through exposure to air or using a controlled oxidation process. In one embodiment, an exposed surface area of the first conductive layer 320 is increased by enhancing a roughness of the exposed first conductive layer 320, thereby increasing the surface area contact to the phase-stable amorphous high-κ dielectric layer 510 formed on or directly adjacent to the first conductive layer 320. The roughness of the exposed first conductive layer 320 may be enhanced during deposition or using a post-deposition treatment process.

Figure 6:
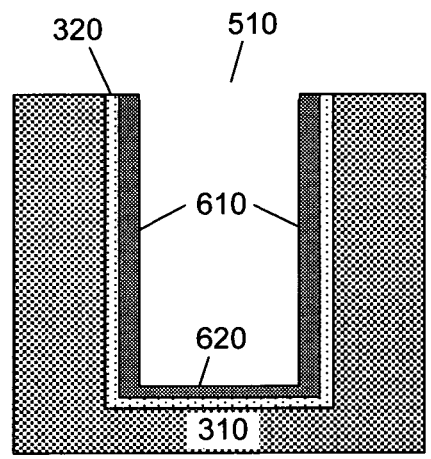
FIG. 6 is a cross-sectional view of FIG. 5 taken through section line A-A illustrating the device in FIG. 5.

FIG. 6 is a cross-sectional view of FIG. 5 taken through section line A-A illustrating the device in FIG. 5. The phase-stable amorphous high-κ dielectric layer 510 is formed in the recess with consistent and uniform thickness to provide dielectric layer sidewalls 610 and dielectric layer bottom 620. A thickness of the phase-stable amorphous high-κ dielectric layer 510 is selectively designed to provide desired device characteristics, approximately between 40 and 60 Å in one embodiment.

Figure 7:
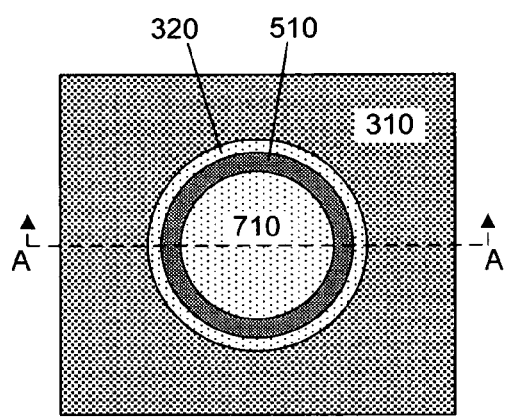
FIG. 7 illustrates one embodiment of the device of FIG. 5 after forming a second conductive layer on the phase-stable amorphous high-κ dielectric layer to create another charge storing device.
Figure 8:
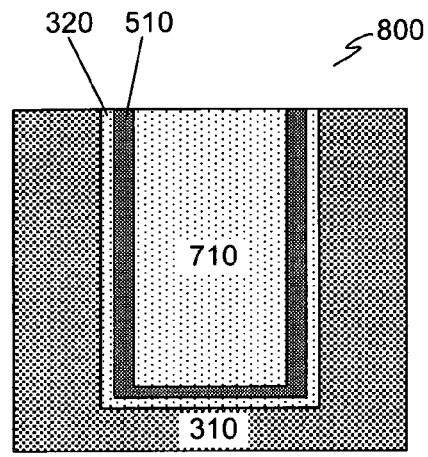
FIG. 8 is a cross-sectional view of FIG. 7 taken through section line A-A illustrating the charge storing device of FIG. 7.

FIG. 7 illustrates one embodiment of the device of FIG. 5 after forming a second conductive layer 710 on the phase-stable amorphous high-κ dielectric layer 510 to create a charge storing device, such as a metal-insulator-metal (MIM) capacitor structure 800 illustrated in FIG. 8. The second conductive layer 710 may be formed using an ALD process, a physical vapor deposition process (PVD), or another deposition process known to one skilled in the art. The second conductive layer 710 illustrated in FIG. 7 and FIG. 8 completely fills a cavity or remaining space of the original recess not filled by the first conductive layer 320 and phase-stable amorphous high-κ dielectric layer 510. In another embodiment, the second conductive layer 710 fills only a portion of the cavity by forming a sidewall with a nominal thickness along the exposed surface of the phase-stable amorphous high-κ dielectric layer 510. A thickness of the second conductive layer 710 is selectively designed to provide a signal path. For example, a thickness of the second conductive layer 710 is greater than approximately 10 angstroms. In some applications, a maximum thickness of the second conductive layer 710 is established by a diameter of the cavity, as illustrated in FIG. 7.

MIM capacitors 800 may be used for a number of functions, for example, as a reservoir capacitor for a charge pump circuit or for noise decoupling. MIM capacitors 800 are valuable components in logic, memory and analog circuits and are typically configured to provide a minimal footprint, thereby minimizing a surface area of an integrated circuit (IC) when viewed from the top of the IC.

Figure 9:
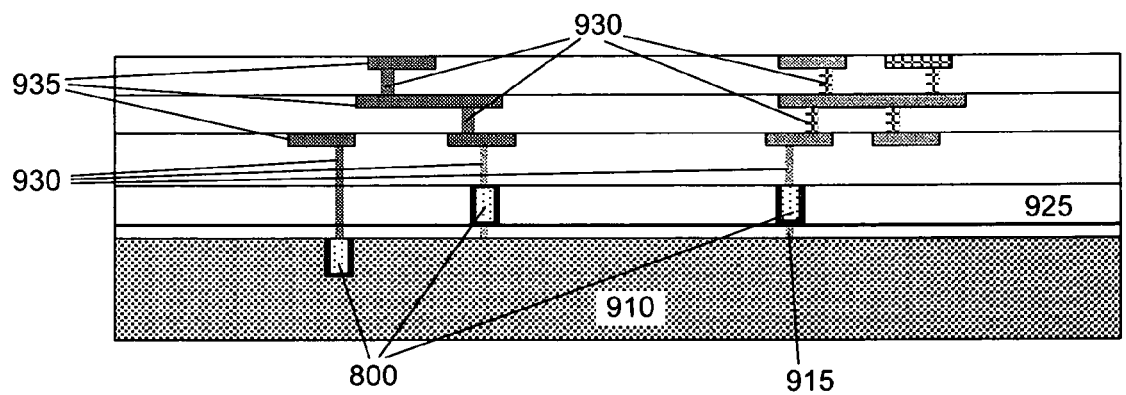
FIG. 9 is an embodiment of an integrated circuit with charge storing devices formed in the integrated circuit.

FIG. 9 is an embodiment of an integrated circuit with charge storing devices such as MIM capacitors 800 formed in the integrated circuit. MIM capacitor 800 may be formed in a substrate 910 and/or formed in an isolation region 310 such as a pre-metal dielectric or an inter-metal dielectric 925 as shown in this embodiment. The MIM capacitors 800 may be coupled to the integrated circuit through a series of electrical paths such as a plug 915, vias 930, and trenches 935.

Figure 10:
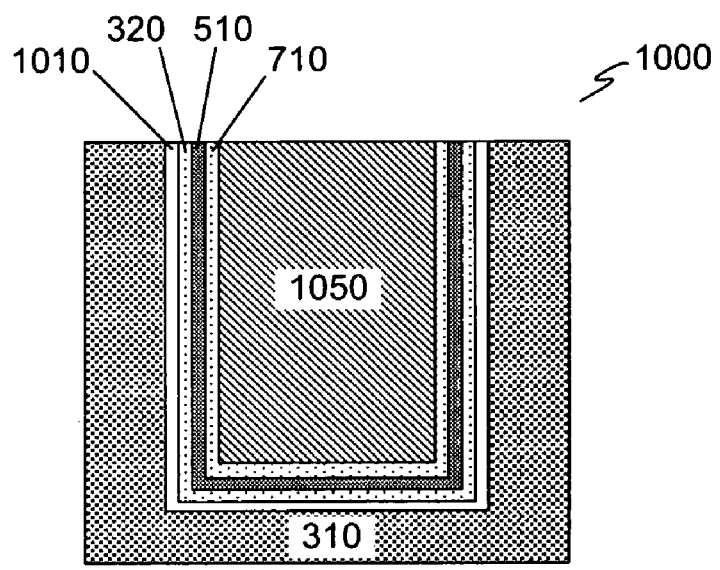
FIG. 10 is a further embodiment of a charge storing device.

FIG. 10 illustrates an alternate embodiment of a charge storing device 1000 fabricated with an isolation layer 1010 formed between an isolation region 310 and the first conductive layer 320. Preferably, the isolation layer 1010 comprises silicon nitride ($Si_3N_4$). In an alternate embodiment, the isolation layer 1010 comprises one or more dielectric materials known to one skilled in the art to provide isolation between the conductive layer and the substrate. A material type and thickness of the isolation layer 1010 is selectively designed to promote electrical isolation between the substrate 210 of FIG. 2 and the first conductive layer 320.

The phase-stable amorphous high-κ dielectric layer 510 is formed on the first conductive layer 320 and the second conductive layer 710 is formed on the phase-stable amorphous high-κ dielectric layer 510. A core 1050 may be formed of a conductive material such as W, Al, or Cu on the second conductive layer 710 in the remaining recess to create the charge storing device 1000. The core 1050 may be formed using an ALD process, a physical vapor deposition process (PVD), a chemical vapor deposition (CVD) process, or another deposition process known to one skilled in the art.

Figure 11:
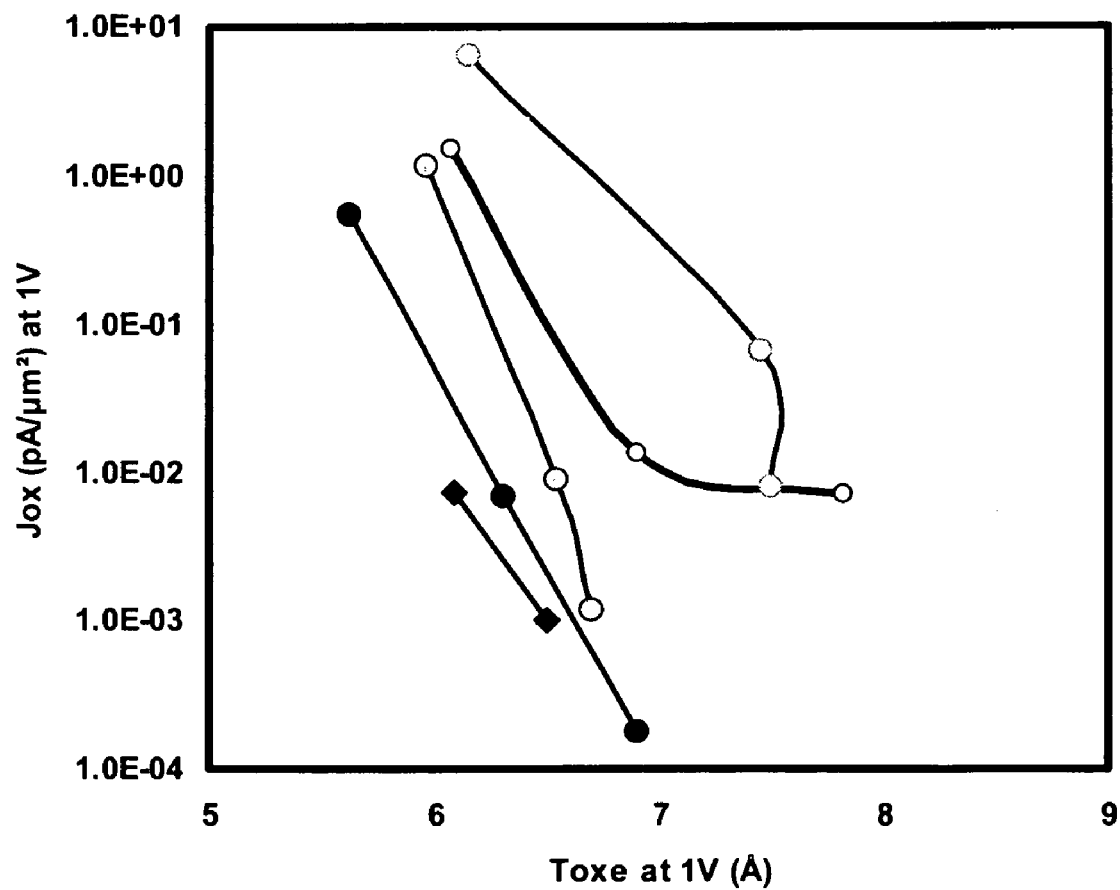
FIG. 11 is an illustration representing leakage current vs. equivalent oxide thickness of charge storing devices before and after an anneal treatment.

FIG. 11 is an illustration representing leakage current (Jox) vs. equivalent oxide thickness (Toxe) of MIM devices before and after an end of line anneal treatment. Lines with empty circles represent characteristics of MIM devices prepared using prior art practices prior to performing an anneal treatment step. Lines with closed circles represent characteristics of MIM devices prepared using prior art practices after performing an anneal treatment step. The line with the closed boxes represents characteristics of a MIM device comprising a phase-stable amorphous high-κ dielectric layer prepared using methods and structures described herein after the end of line anneal treatment. As shown in FIG. 11, the MIM device comprising a phase-stable amorphous high-κ dielectric layer prepared using the methods described herein unexpectantly provides substantially thinner equivalent oxide thickness (resulting in a higher capacitance) along with the lowest leakage. By way of example, it is shown that MIM devices comprising a phase-stable amorphous high-κ dielectric layer prepared using the methods described herein may result in up to three orders of magnitude less leakage than MIM devices prepared using prior art practices.

A plurality of embodiments of an apparatus and methods for forming a phase-stable amorphous high-κ dielectric layer in a device have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit, comprising:
   a first conductive layer directly adjacent to an isolation region;
   a phase-stable amorphous high-κ dielectric layer comprising a precursor by-product directly adjacent to the first conductive layer; and
   a second conductive layer formed directly adjacent to the phase-stable amorphous high-κ dielectric layer.

2. The integrated circuit of claim 1, wherein the phase-stable amorphous high-κ dielectric layer is formed at a deposition temperature substantially between 230 C and 270 C.

3. The integrated circuit of claim 1, wherein the precursor by-product of the phase-stable amorphous high-κ dielectric layer is selected from the group consisting of Cl, N, and C.

4. The integrated circuit of claim 1, wherein a thickness of the phase-stable amorphous high-κ dielectric layer is approximately between 40 and 60 angstroms (Å).

5. The integrated circuit of claim 1, wherein the phase-stable amorphous high-κ dielectric layer is fully amorphous.

6. The integrated circuit of claim 1, wherein an oxygen content of the phase-stable amorphous high-κ dielectric layer is sub-stoichiometric.

7. A device configured for charge storage, comprising:
   a first conductive layer directly adjacent to a surface of a recess;
   a phase-stable amorphous high-k layer comprising a precursor by-product directly adjacent to the first conductive layer to form a cavity; and
   a second conductive layer formed in the cavity.

8. The device of claim 7, wherein the phase-stable amorphous high-κ dielectric layer is formed at a deposition temperature substantially between 230 C and 270 C.

9. The device of claim 7, wherein the precursor by-product of the phase-stable amorphous high-κ dielectric layer is selected from the group consisting of Cl, N, and C.

10. The device of claim 7, wherein a thickness of the phase-stable amorphous high-κ dielectric layer is approximately between 40 and 60 angstroms (Å).

11. The device of claim 7, wherein the phase-stable amorphous high-κ dielectric layer is fully amorphous.

12. The device of claim 7, wherein the first conductive layer is formed directly adjacent to an isolation layer.

13. The device of claim 7, further including a conductive core directly adjacent to the second conductive layer.

* * * * *